United States Patent
Hirano et al.

(10) Patent No.: US 11,081,367 B2
(45) Date of Patent: *Aug. 3, 2021

(54) SUPPORT AND METHOD FOR PRODUCING SEMICONDUCTOR DEVICE-MOUNTING SUBSTRATE USING THE SAME

(71) Applicant: MITSUBISHI GAS CHEMICAL COMPANY, INC., Tokyo (JP)

(72) Inventors: Shunsuke Hirano, Yamagata (JP); Yoshihiro Kato, Yamagata (JP); Takaaki Ogashiwa, Yamagata (JP); Kazuaki Kawashita, Yamagata (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/606,828

(22) PCT Filed: Apr. 23, 2018

(86) PCT No.: PCT/JP2018/016410
§ 371 (c)(1),
(2) Date: Oct. 21, 2019

(87) PCT Pub. No.: WO2018/199003
PCT Pub. Date: Nov. 1, 2018

(65) Prior Publication Data
US 2020/0043752 A1    Feb. 6, 2020

(30) Foreign Application Priority Data

Apr. 27, 2017  (JP) .............................. JP2017-088834

(51) Int. Cl.
*H01L 21/48*   (2006.01)
*H01L 23/498*  (2006.01)

(52) U.S. Cl.
CPC ........ *H01L 21/4857* (2013.01); *H01L 21/481* (2013.01); *H01L 23/49822* (2013.01); *H01L 23/49894* (2013.01)

(58) Field of Classification Search
None
See application file for complete search history.

(56) References Cited

U.S. PATENT DOCUMENTS

2006/0027900 A1* 2/2006 Takeuchi ............ H01L 23/4334
257/675
2014/0182126 A1 7/2014 Daisuke et al.
(Continued)

FOREIGN PATENT DOCUMENTS

EP    3 496 138 A1   6/2019
JP    2003-218524    7/2003
(Continued)

OTHER PUBLICATIONS

Official Communication issued in International Bureau of WIPO Patent Application No. PCT/JP2018/016410, dated Jul. 10, 2018.

*Primary Examiner* — Asok K Sarkar
(74) *Attorney, Agent, or Firm* — Greenblum & Bernstein P.L.C.

(57) ABSTRACT

A support including a heat resistant film layer and a resin layer, wherein the heat resistant film layer is laminated on at least one side (a first side) of the resin layer, and the resin layer is in a semi-cured state (B stage).

16 Claims, 4 Drawing Sheets

(56) References Cited

U.S. PATENT DOCUMENTS

| | | |
|---|---|---|
| 2015/0035126 A1 | 2/2015 | Gandhi |
| 2015/0231858 A1 | 8/2015 | Van Neer |
| 2015/0342040 A1 | 11/2015 | Wang |
| 2017/0213745 A1 | 7/2017 | Kato et al. |

FOREIGN PATENT DOCUMENTS

| | | |
|---|---|---|
| JP | 2005-101137 | 4/2005 |
| JP | 2008-205269 | 9/2008 |
| JP | 2009-38134 | 2/2009 |
| JP | 2014-90123 | 5/2014 |
| JP | 2017-45794 | 3/2017 |
| WO | 2016/010083 | 1/2016 |

* cited by examiner (1A)

(1B)

(1C)

(1D)

(1I)

(1J)

(1K)

SUPPORT AND METHOD FOR PRODUCING SEMICONDUCTOR DEVICE-MOUNTING SUBSTRATE USING THE SAME

TECHNICAL FIELD

The present invention relates to a support capable of enhancing handling properties of a substrate when a semiconductor device is mounted and a method for producing a semiconductor device-mounting substrate using the same.

BACKGROUND ART

Function advancement and downsizing of semiconductor packages commonly used for electronic equipment, communications equipment and personal computers have been accelerating ever faster in recent years. Accordingly, a demand is placed on a thinner printed wiring board and a package substrate for loading a semiconductor device of a semiconductor package. Typically, a printed wiring board and a package substrate for loading a semiconductor device are manufactured by laminating layers to be circuit patterns (hereinafter, simply referred to as "wire conductor") and insulating materials on a support substrate.

As a method for producing such a package substrate for loading a semiconductor device, a method is disclosed in which a support substrate for circuit formation including an ultra-thin copper foil with a carrier foil and a first insulating resin on the carrier foil surface is used, the method including forming a first wire conductor by pattern electro copper plating, further laminating a second insulating resin thereon, and subsequently forming a second wire conductor, for example (e.g., see Patent Document 1).

CITATION LIST

Patent Document

Patent Document 1: Japanese Patent Laid-Open No. 2005-101137

SUMMARY OF INVENTION

Technical Problem

As described above, thinning package substrates for loading a semiconductor device has been advanced in recently years, and 3-layer coreless substrates (ETS) having a thickness of about 90 μm are mass-produced. Further thinning will advance from now on, and substrates having a thickness of about 60 μm are presumed to be distributed within several years. However, as a substrate becomes thinner, handling properties aggravate, which unfortunately makes it difficult to implement a semiconductor device on the substrate.

In view of the above circumstances, the present invention has an object to provide a support capable of enhancing the handling properties of a package substrate and enabling easy mounting of a semiconductor device.

Further, the present invention has an object to provide a method for producing a semiconductor device-mounting substrate using such a support.

Solution to Problem

The present inventors have conducted extensive studies and found that a support comprising a heat resistant film layer and a resin layer, wherein the resin layer is in a semi-cured state (B stage), can solve the above problems, whereby the present invention was accomplished.

More specifically, the present invention is as follows.

[1]
A support comprising:
a heat resistant film layer; and
a resin layer,
wherein the heat resistant film layer is laminated on at least one side (a first side) of the resin layer, and
the resin layer is in a semi-cured state (B stage).

[2]
The support according to [1], wherein a copper foil is further laminated on another side (a second side) of the resin layer, the second side is oppose to the side on which the heat resistant film layer is laminated.

[3]
The support according to [1] or [2], wherein the heat resistant film layer comprises at least one resin selected from the group consisting of polyimide resins, polyamideimide resins, nylon resins and fluorine-based resins.

[4]
The support according to any of [1] to [3], wherein the heat resistant film layer is a heat resistant film layer with an adhesive layer and the adhesive layer comprises at least one resin selected from the group consisting of phenol resins, epoxy resins, cyanate resins, maleimide resins, isocyanate resins, benzocyclobutene resins and vinyl resins.

[5]
The support according to any of [1] to [4], wherein the support has a thickness of 10 to 400 μm.

[6]
The support according to any of [1] to [5], wherein the resin layer comprises a prepreg in which a thermosetting resin is impregnated in a glass cloth.

[7]
The support according to [6], wherein the thermosetting resin comprises at least one resin selected from the group consisting of phenol resins, epoxy resins, cyanate resins, maleimide resins, bismaleimide triazine resins, isocyanate resins, benzocyclobutene resins and vinyl resins.

[8]
The support according to any of [1] to [7], wherein the heat resistant film layer has a smaller surface area than the resin layer.

[9]
A method for producing a semiconductor device-mounting substrate in which the support according to any of [1] to [8] is used,
the production method comprising a step of laminating, by pressing, the support on a circuit formation substrate on which a first and a second wire conductors are formed, and subsequently mounting a semiconductor device on the wire conductors.

[10]
The method for producing the semiconductor device-mounting substrate according to [9], comprising the following steps:
(a) a step of forming a support substrate for circuit formation comprising a first insulating resin layer, a peel layer and a copper foil in this order,
(b) a step of forming a first wire conductor on the copper foil of the support substrate for circuit formation,
(c) a step of laminating a second insulating resin layer, by disposing the second insulating resin layer in such a way that he second insulating resin layer is in contact with the first wire conductor; and heating and applying a pressure on the second insulating resin layer, (d) a step of drilling a non-through hole reaching the first wire conductor in the second insulating resin layer; and connecting an inner wall of the non-through hole by electro copper plating and/or electroless copper plating; and forming a second wire conductor, (e) a step of peeling the first insulating resin layer from the circuit formation substrate on which the first and the second wire conductors are formed, (f) a step of removing the peel layer and/or the copper foil from the circuit formation substrate, (g) a step of laminating the support on the circuit formation substrate by pressing, (h) a step of mounting a semiconductor device on the wire conductors of the circuit formation substrate, and (i) a step of peeling the support from the circuit formation substrate.

[11]

The method for producing the semiconductor device-mounting substrate according to [10], further comprising, between the step (d) and the step (e), a step of forming a build-up structure, by repeating an insulating resin layer lamination step and a wire conductor formation step on the circuit formation substrate on which the first and the second wire conductors are formed.

[12]

The method for producing the semiconductor device-mounting substrate according to [10] or [11], further comprising a step of forming a solder resist layer between the step (f) and the step (g).

[13]

The method for producing the semiconductor device-mounting substrate according to [12], further comprising a step of forming a gold-plated layer after the step of forming a solder resist layer.

[14]

The method for producing the semiconductor device-mounting substrate according to [10] or [11], comprising a step of forming a solder resist layer between the step (d) and the step (e).

[15]

The method for producing the semiconductor device-mounting substrate according to [14], further comprising a step of forming a gold-plated layer after the step of forming a solder resist layer.

[16]

The method for producing the semiconductor device-mounting substrate according to [9], comprising the following steps:

(a) a step of forming a support substrate for circuit formation comprising a first insulating resin layer, a peel layer and a copper foil in this order, (b) a step of forming a first wire conductor on the copper foil of the support substrate for circuit formation, (c) a step of laminating a second insulating resin layer, by disposing the second insulating resin layer in such a way that the second insulating resin layer is in contact with the first wire conductor; and heating and applying a pressure on the second insulating resin layer, (d) a step of drilling a non-through hole reaching the first wire conductor in the second insulating resin layer; and connecting an inner wall of the non-through hole by electro copper plating and/or electroless copper plating; and forming a second wire conductor, (j) a step of laminating the support by pressing the support on the circuit formation substrate on which the first and the second wire conductors are formed, (k) a step of peeling the first insulating resin layer from the circuit formation substrate on which the support is laminated, (l) a step of removing the peel layer and/or the copper foil from the circuit formation substrate, (h) a step of mounting a semiconductor device on the wire conductors of the circuit formation substrate, and (i) a step of peeling the support from the circuit formation substrate.

[17]

The method for producing the semiconductor device-mounting substrate according to [16], further comprising, between the step (d) and the step (e), a step of forming a build-up structure, by repeating an insulating resin layer lamination step and a wire conductor formation step on the circuit formation substrate on which the first and the second wire conductors are formed.

[18]

The method for producing the semiconductor device-mounting substrate according to [16] or [17], further comprising a step of forming a solder resist layer between the step (l) and the step (h).

[19]

The method for producing the semiconductor device-mounting substrate according to [18], further comprising a step of forming a gold-plated layer after the step of forming a solder resist layer.

Advantageous Effects of Invention

Use of a support of the present invention enhances the handling properties of a package substrate for loading a semiconductor device and enables easy mounting of a semiconductor device and application of a solder resist on a substrate.

DESCRIPTION OF EMBODIMENTS

Figure 1:
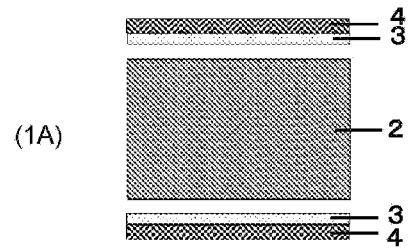
FIG. 1 is drawings (FIG. 1A to FIG. 1D) schematically showing the production method of Embodiment 1.
Figure 1:
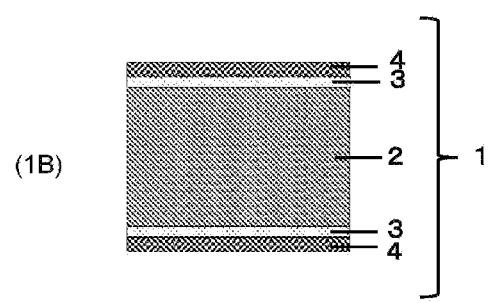
Figure 1:
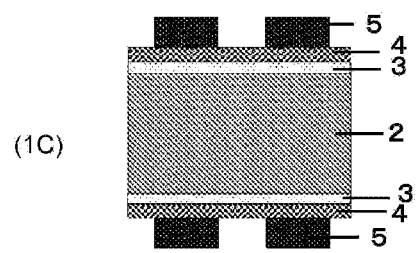
Figure 1:
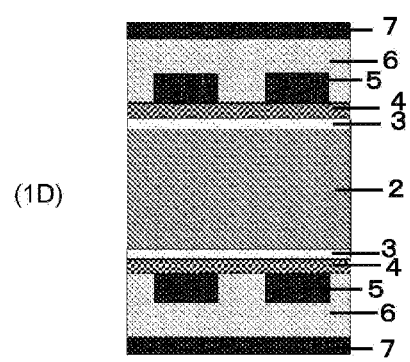

Hereinbelow, embodiments for carrying out the present invention (hereinafter referred to as "the present embodiment") are described in detail. The present invention is not limited to the following embodiments and can be carried out in various modifications within the scope of the gist thereof.

In the present embodiments, "(meth)acrylo" means both "acrylo", and "methacrylo" corresponding thereto; "(meth)acryl" means both "acryl", and "methacryl" corresponding thereto; and "(meth)acrylate" means both "acrylate", and "methacrylate" corresponding thereto.

<Support>

The support of the present embodiment contains:
a heat resistant film layer; and
a resin layer, wherein the heat resistant film layer is laminated on at least one side (a first side) of the resin layer, and the resin layer is in a semi-cured state (B stage).

[Resin Layer]

The resin layer is not particularly limited and those to be described later as a first and a second insulating resin layers can be used. Among them, in view of heat resistance and dimensional stability of a substrate, it is preferable to include a prepreg in which a thermosetting resin is impregnated in a glass cloth.

The glass cloth is not particularly limited and examples include a glass fiber and a plain weave glass cloth. These glass clothes may be used singly, or in combinations of 2 or more in the form of a mixture.

Examples of the thermosetting resin include a phenol resin, an epoxy resin, a cyanate resin, a maleimide resin, a bismaleimide triazine resin (also referred to as "BT resin"), an isocyanate resin, a benzocyclobutene resin and a vinyl resin. These thermosetting resins may be used singly, or in combinations of 2 or more in the form of a mixture. Of these thermosetting resins, in view of heat resistance and dimensional stability of a substrate, a bismaleimide triazine resin, an epoxy resin, a cyanate resin and a maleimide resin are preferable, and a bismaleimide triazine resin is more preferable. Specific examples of each of the phenol resin, the epoxy resin, the cyanate resin, the maleimide resin, the isocyanate resin, the benzocyclobutene resin and the vinyl resin are as described for the thermosetting resins used for a resin composition of the insulation material to be described later.

The resin layer has its cure degree of a semi-cured state (B stage). The resin layer in a semi-cured state enhances the followability of a support to a substrate for loading a semiconductor device and simultaneously makes it easy to peel the support by a physical force after mounting semiconductor device.

For the prepreg, a commercial product can also be used and, for example, GHPL-830NS (product name) manufactured by MITSUBISHI GAS CHEMICAL COMPANY, INC. can be used.

[Heat Resistant Film Layer]

The support of the present embodiment has a heat resistant film layer laminated on at least one side of the resin layer. The heat resistant film layer is not particularly limited as long as it is a film formed of a heat resistant resin and examples of the heat resistant resin include a polyimide resin, a polyamideimide resin, a nylon resin and a fluorine-based resin. These heat resistant resins may be used singly, or in combinations of 2 or more in the form of a mixture. Of these heat resistant resins, a polyimide resin and a fluorine-based resin are preferable in view of heat resistance.

The polyimide resin is not particularly limited and examples include polyamideimide, polypyromellitic diimide, bismaleimide and polyetherimide. These polyimide resins may be used singly, or in combinations of 2 or more in the form of a mixture.

The polyamideimide resin is not particularly limited and examples include a resin obtained by heating a trimellitic anhydride, a benzophenone tetracarboxylic anhydride and bitolylene diisocyanate in a solvent of N-methyl-2-pyrrolidone and/or N,N-dimethylacetamide, and a resin obtained by heating a trimellitic anhydride, diphenylmethane diisocyanate and a carboxyl group-terminal (meth)acrylonitrile-butadiene rubber in a solvent of N-methyl-2-pyrrolidone and/or N,N-dimethylacetamide. These polyamideimide resins may be used singly, or in combinations of 2 or more in the form of a mixture.

The nylon resin is not particularly limited and examples include nylon 6, nylon 6,6 and aramid. These nylon resins may be used singly, or in combinations of 2 or more in the form of a mixture.

The fluorine-based resin is not particularly limited and examples include polytetrafluoroethylene, polyvinylidene fluoride and polychlorotrifluoroethylene. These fluorine-based resins may be used singly, or in combinations of 2 or more in the form of a mixture.

The heat resistant film layer may be a heat resistant film layer with an adhesive layer. When the heat resistant film layer is a heat resistant film layer with an adhesive layer, the heat resistant film layer is disposed such that the adhesive layer contacts the insulating resin layer.

The resin for forming the adhesive layer is not particularly limited and examples include a phenol resin, an epoxy resin, a cyanate resin, a maleimide resin, an isocyanate resin, a benzocyclobutene resin, a bismaleimide triazine resin and a vinyl resin. These resins forming the adhesive layer may be used singly, or in combinations of 2 or more in the form of a mixture. Specific examples of each of the phenol resin, the epoxy resin, the cyanate resin, the maleimide resin, the isocyanate resin, the benzocyclobutene resin and the vinyl resin are as described for the thermosetting resins used for a resin composition of the insulation material to be described later.

For the heat resistant film with an adhesive layer, a commercial product can also be used and, for example, CISV (product name) manufactured by NIKKAN INDUSTRIES Co., Ltd. can be used.

[Copper Foil]

The support of the present embodiment may further have a copper foil laminated on another side (a second side) of the insulating resin layer, the second side is opposed to the side on which the above heat resistant film layer is laminated. Further lamination of a copper foil on the second side of the resin layer has an advantage for enhancing the stiffness of a substrate.

For the copper foil, the same as the copper foils to be described later can be used.

The thickness of the support is not particularly limited but, in view of enhancing the handling properties of the substrate, preferably 10 μm or more, more preferably 50 μm or more and further preferably 100 μm or more. The upper limit in the thickness of the support is not particularly limited but is preferably 400 μm or less, more preferably 300 μm or less and further preferably 200 μm or less because when the support is too thick, transportability and mass productivity are likely to be poor.

Further, the support of the present embodiment may have a smaller surface area of the heat resistant film layer than a surface area of the resin layer. When a surface area of the heat resistant film layer is smaller than a surface area of the resin layer, an adhesive strength between the support and a circuit formation substrate can be enhanced, advantageously enabling easy cutting of a laminated substrate to a package size before mounting a semiconductor device.

The method for producing a support is not particularly limited and may be as follows, for examples: a heat resistant film layer is disposed on at least one side of the resin layer; a copper foil is disposed, if needed, on the other side that is oppose to the side on which the heat resistant film layer is laminated; subsequently vacuum press is carried out under conditions at a temperature of 40 to 100° C., a pressure of 1 to 3 MPa, and for a hold time of 1 to 20 minutes.

<Method for Producing a Semiconductor Device-Mounting Substrate>

The method for producing a semiconductor device-mounting substrate of the present embodiment is a production method in which the support is used and includes laminating, by pressing, the support on a circuit formation substrate on which a first and a second wire conductors are formed, and subsequently mounting a semiconductor device on the wire conductors. The method for producing the semiconductor device-mounting substrate of the present embodiment can enhance the handling properties of the substrate by using the support, thus enabling easy mounting of a semiconductor device and application of a solder resist even when the substrate is extremely thin.

Hereinbelow, more specific production method is described.

Embodiment 1

The method for producing the semiconductor device-mounting substrate of the first embodiment (Embodiment 1) for carrying out the present invention contains the following steps.

(a) a step of forming a support substrate for circuit formation including a first insulating resin layer, a peel layer and a copper foil in this order, (b) a step of forming a first wire conductor on the copper foil of the support substrate for circuit formation, (c) a step of laminating a second insulating resin layer, by disposing the second insulating resin layer in such a way that the second insulating resin layer is in contact with the first wire conductor; and heating and applying a pressure on the second insulating resin layer, (d) a step of drilling a non-through hole reaching the first wire conductor in the second insulating resin layer, and connecting an inner wall of the non-through hole by electro copper plating and/or electroless copper plating; and forming a second wire conductor, (e) a step of peeling the first insulating resin layer from the circuit formation substrate on which the first and the second wire conductors are formed, (f) a step of removing the peel layer and/or the copper foil from the circuit formation substrate, (g) a step of laminating the support on the circuit formation substrate by pressing, (h) a step of mounting a semiconductor device on the wire conductors of the circuit formation substrate, and (i) a step of peeling the support from the circuit formation substrate.

[Step (a)]

Step (a) of the present embodiment is a step of forming a support substrate for circuit formation including a first insulating resin layer, a peel layer and a copper foil in this order.

The first insulating resin layer may have the peel layer and the copper foil disposed on one side, but these layers are preferably disposed on both sides of the first insulating resin layer. More specifically, the support substrate for circuit formation of the present embodiment is preferably a 2-layer core substrate with a peel layer. With reference to FIG. 1, the configuration of a support substrate for circuit formation (2-layer core substrate with a peel layer) 1 is described. As shown in FIG. 1B, the support substrate for circuit formation 1 has a peel layer 3 and a copper foil 4 provided on both sides of a first insulating resin layer (for example, a prepreg) 2 sequentially from the surface thereof.

The support substrate for circuit formation can be formed by a formation method in which a peel layer is formed on the copper foil followed by disposing them on a first insulating resin layer, but the method is not limited to such a formation method or to any particular method as long as a peel layer and a copper foil are laminated in this order on a first insulating resin layer. For example, a copper foil of a specified thickness having a peel layer formed (hereinafter, also referred to as "a copper foil with a peel layer") is disposed in such a way that the peel layer surface is in contact with a first insulating resin layer such as a prepreg and laminated by heating and applying a pressure thereby to form the peel layer and the copper foil on the first insulating resin layer. In this case, after lamination, a known treatment such as etching treatment is applied as needed so that the copper foil has an intended thickness, whereby a support substrate for circuit formation including the first insulating resin layer, the peel layer and the copper foil in this order can be prepared. The copper foil with a peel layer is not particularly limited but, for example, those wherein a peel layer is formed on a copper foil having a thickness of 1 μm to 20 μm can be used. Alternatively, a peel layer is formed on a first insulating resin layer, and subsequently a copper foil is disposed thereon, thereby to form a support substrate for circuit formation.

The lamination method and conditions are not particularly limited but, for example, vacuum press is carried out under conditions at a temperature of 220±2° C., a pressure of 5±0.2 MPa, and a hold time of 60 minutes thereby to form a support substrate for circuit formation.

(First Insulating Resin Layer)

The first insulating resin layer of the step (a) is not particularly limited but, for example, a prepreg in which an insulating resin material (insulation material) such as a thermosetting resin is impregnated in a base material such as a glass cloth and an insulating film material can be used.

A "prepreg" is obtained by impregnating or coating a base material with an insulation material such as a resin composition. The base material is not particularly limited and those known to have been used for a laminated plate for various electrical insulation materials can be suitably used. Examples of the material for forming the base material include an inorganic fiber such as E-glass, D-glass, S-glass and Q-glass; an organic fiber such as polyimide, polyester and tetrafluoroethylene; and mixtures thereof. The base material is not particularly limited and, for example, those in the forms of a woven cloth, a non-woven cloth, a roving, a chopped strand mat and a surfacing mat can be suitably used. The material quality and the form of the base material are selected depending on the purpose of use and performance of an intended molded product, and these materials may be used singly, or in combinations of 2 or more in terms of qualities and forms as needed.

The thickness of the base material is not particularly limited but typically those having a thickness of 0.02 to 0.50 mm can be used. Further, for the base material, those surface-treated with a silane coupling agent and those subjected to a mechanical opening treatment can be used, and these base materials are preferable in view of heat resistance, moisture resistance and processability.

The insulation material is not particularly limited, and a known resin composition used as an insulation material for a printed wiring board can be suitably selected and used. For the resin composition, a thermosetting resin with good heat resistance and chemical resistance can be used as a base. The thermosetting resin is not particularly limited and examples include a phenol resin, an epoxy resin, a cyanate resin, a maleimide resin, a bismaleimide triazine resin, an isocyanate resin, a benzocyclobutene resin and a vinyl resin. These thermosetting resins may be used singly, or in combinations of 2 or more in the form of a mixture.

The phenol resin is not particularly limited and a generally known resin can be used as long as a phenol resin has 2 or more hydroxy groups in 1 molecule. Examples include a bisphenol A-based phenol resin, a bisphenol E-based phenol resin, a bisphenol F-based phenol resin, a bisphenol S-based phenol resin, a phenol novolac resin, a bisphenol A novolac-based phenol resin, a glycidyl ester-based phenol resin, an aralkyl novolac-based phenol resin, a biphenyl aralkyl-based phenol resin, a cresol novolac-based phenol resin, a polyfunctional phenol resin, a naphthol resin, a naphthol novolac resin, a polyfunctional naphthol resin, an anthracene-based phenol resin, a naphthalene skeleton-modified novolac-based phenol resin, a phenol aralkyl-based phenol resin, a naphthol aralkyl-based phenol resin, a dicyclopentadiene-based phenol resin, a biphenyl-based phenol resin, a cyclic phenol resin, a polyol-based phenol resin, a phosphorus-containing phenol resin, and a hydroxyl group-containing silicone resin. These phenol resins may be used singly, or in combinations of 2 or more in the form of a mixture.

Of the thermosetting resins, an epoxy resin, which has good heat resistance, chemical resistance and electrical properties and being comparatively inexpensive, can be thus preferably used as an insulation material. The epoxy resin is not particularly limited and examples include a bisphenol A-based epoxy resin, a bisphenol F-based epoxy resin, a bisphenol S-base epoxy resin, an alicyclic epoxy resin, a aliphatic chain epoxy resin, a phenol novolac-based epoxy resin, a cresol novolac-based epoxy resin, a bisphenol A novolac-based epoxy resin, diglycidyl etherified biphenol, diglycidyl etherified naphthalenediol, diglycidyl etherified phenol, diglycidyl etherified alcohol, alkyl-substitution, a halide and a hydrogen additive thereof. These epoxy resins may be used singly, or in combinations of 2 or more in the form of a mixture. Further, any curing agent can be used with such an epoxy resin without limitation as long as it cures an epoxy resin and examples include a polyfunctional phenol, a polyfunctional alcohol, an amine, an imidazole compound, an acid anhydride, an organophosphorous compound and a halide thereof. These epoxy resin curing agents may be used singly, or in combinations of 2 or more in the form of a mixture.

The cyanate resin is a resin which produces a cured product having a repeating unit of a triazine ring when heated and the cured product has good dielectric properties. For this reason, such a resin is preferable particularly in the case where high frequency properties are required. The cyanate resin is not particularly limited and examples include 2,2-bis(4-cyanatophenyl)propane, bis(4-cyatophenyl)ethane, 2,2-bis(3,5-dimethyl-4-cyatophenyl)methane, a 2,2-(4-cyatophenyl)-1,1,1,3,3,3-hexafluoropropane, α,α'-bis(4-cyatophenyl)-m-diisopropylbenzene, a phenol novolac and a cyanate esterified product of alkyl phenol novolac. These cyanate resins may be used singly, or in combinations of 2 or more in the form of a mixture. Further, the cyanate esterified compound may be partially oligomerized in advance to a trimer or a pentamer. Of these, 2,2-bis(4-cyatophenyl)propane has good balance particularly in the dielectric properties of a cured product and curability and a low cost, which is preferable.

Further, a curing catalyst or a curing accelerator may be used concurrently to the cyanate resin.

For the curing catalyst, for example, a metal such as manganese, iron, cobalt, nickel, copper and zinc can be used and examples specifically include an organometallic salt such as 2-ethylhexanoate and octate and an organometallic complex such as an acetylacetonate complex. These curing catalysts may be used singly, or in combinations of 2 or more in the form of a mixture.

For the curing accelerator, phenols are preferably used, and a monofunctional phenol such as nonylphenol and paracumylphenol, a bifunctional phenol such as bisphenol A, bisphenol F and bisphenol S or a polyfunctional phenol such as phenol novolac and cresol novolac can be used. These curing accelerators may be used singly, or in combinations of 2 or more in the form of a mixture.

A generally known maleimide compound can be used as long as a compound has 1 or more maleimide groups in 1 molecule. Examples include 4,4-diphenylmethane bismaleimide, phenylmethane maleimide, m-phenylenebismaleimide, 2,2-bis(4-(4-maleimidophenoxy)-phenyl)propane, 3,3-dimethyl-5,5-diethyl-4,4-diphenylmethane bismaleimide, 4-methyl-1,3-phenylenebismaleimide, 1,6-bismaleimide-(2,2,4-trimethyl)hexane, 4,4-diphenylether bismaleimide, 4,4-diphenyl sulfone bismaleimide, 1,3-bis(3-maleimidophenoxy)benzene, 1,3-bis(4-maleimidophenoxy)benzene, polyphenylmethane maleimide, novolac-based maleimide, biphenyl aralkyl-based maleimide, and a prepolymer of these maleimide compounds and a prepolymer of a maleimide compound and an amine compound, but not limited thereto. These maleimide compounds may be used singly, or in combinations of 2 or more in the form of a mixture.

The isocyanate resin is not particularly limited and includes, for example, an isocyanate resin obtained by dehydrohalogenation reaction of a phenol and a cyanogen halide. Examples of the isocyanate resin include 4,4'-diphenylmethane diisocyanate MDI, polymethylene polyphenyl polyisocyanate, tolylene diisocyanate and hexamethylene diisocianate. These isocyanate resins may be used singly, or in combinations of 2 or more in the form of a mixture.

The benzocyclobutene resin is not particularly limited as long as it includes a cyclobutene skeleton and, for example, divinylsiloxane-bisbenzocyclobutene (manufactured by The Dow Chemical Company) can be used. These benzocyclobutene resins may be used singly, or in combinations of 2 or more in the form of a mixture.

The vinyl resin is not particularly limited as long as it is a polymer or a copolymer of vinyl monomers, and the vinyl monomer is not particularly limited and examples include a (meth)acrylate derivative, a vinyl ester derivative, a maleic diester derivative, a (meth)acrylamide derivative, a styrene derivative, a vinyl ether derivative, a vinyl ketone derivative, an olefin derivative, a maleimide derivative and (meth)acrylonitrile. These vinyl resins may be used singly, or in combinations of 2 or more in the form of a mixture.

A thermosetting resin can be blended in the resin composition used as the insulation material in consideration with dielectric properties, shock resistance and film processability. The thermosetting resin is not particularly limited and examples include a fluororesin, polyphenylene ether, modified polyphenylene ether, polyphenylene sulfide, polycarbonate, polyetherimide, polyether ether ketone, poly(meth)acrylate, polyamide, polyamideimide and polybutadiene. These thermosetting resins may be used singly, or in combinations of 2 or more in the form of a mixture.

The fluororesin is not particularly limited and examples include polytetrafluoroethylene, polychlorotrifluoroethylene, polyvinylidene fluoride and polyvinyl fluoride. These fluororesins may be used singly, or in combinations of 2 or more in the form of a mixture.

Of the thermosetting resins, it is useful that polyphenylene ether and/or modified polyphenylene ether be used in view of enhancing the dielectric properties of a cured product. The polyphenylene ether and the modified polyphenylene ether are not particularly limited and examples include poly(2,6-dimethyl-1,4-phenylene)ether, an alloyed polymer of poly(2,6-dimethyl-1,4-phenylene)ether and polystyrene, an alloyed polymer of poly(2,6-dimethyl-1,4-phenylene)ether and a styrene-butadiene copolymer, an alloyed polymer of poly(2,6-dimethyl-1,4-phenylene)ether and a styrene-maleic anhydride copolymer, an alloyed polymer of poly(3,6-dimethyl-1,4-phenylene)ether and polyamide and an alloyed polymer of poly(2,6-dimethyl-1,4-phenylene)ether and a styrene-butadiene-(meth)acrylonitrile copolymer. These polyphenylene ether and modified polyphenylene ether may be used singly, or in combinations of 2 or more in the form of a mixture. Further, for imparting the reactivity and polymerizability to polyphenylene ether, a functional group such as an amine group, an epoxy group, a carboxyl group or a styryl group may be introduced to a polymer chain terminal or a functional group such as an amine group, an epoxy group, a carboxyl group, a styryl group or a methacrylate group may be introduced to a side chain of a polymer chain.

The polyphenylene sulfide is a polymer including aromatic rings via sulfide bonds and examples thereof include a branched or a linear polyphenylene sulfide and a copolymer thereof. Examples include paraphenylene sulfide, metaphenylene sulfide and a polymer thereof and a copolymer having in a molecule an ether unit, a sulfone unit, a biphenyl unit, a naphthyl unit, a substituted phenylsulfide unit or a trifunctional phenylsulfide unit copolymerizable therewith. These polyphenylene sulfide may be used singly, or in combinations of 2 or more in the form of a mixture.

The polycarbonate is not particularly limited and examples include a brominated polycarbonate oligomer. The molecular weight of a brominated polycarbonate oligomer is not particularly limited but those having a weight average molecular weight of 500 to 3500 are preferable.

The polyetherimide is not particularly limited and examples include a condensation product of a 2,2-bis[4-(2,3-dicarboxyphenoxy)phenyl]propane dianhydride and m-phenylene diamine or p-phenylene diamine and a copolymer and a modified product thereof. These polyetherimide may be used singly, or in combinations of 2 or more in the form of a mixture. For the polyetherimide, a commercial product can also be used and examples include a series of "Ultem (registered trademark)" 1000, 5000 and 6000 manufactured by GE Plastics.

The polyether ether ketone is not particularly limited and examples include a copolymer of 4,4'-difluorobenzophenone and hydroquinone. These polyether ether ketones may be used singly, or in combinations of 2 or more in the form of a mixture.

The poly(meth)acrylate is not particularly limited and examples include tris(2-(meth)acryloyloxyethyl)isocyanurate. These poly(meth)acrylate may be used singly, or in combinations of 2 or more in the form of a mixture.

The polyamide is not particularly limited and examples include polyamide 12, polyamide 11, polyamide 6, polyamide 6,6 and a polyamide 6/12 copolymer. These polyamides may be used singly, or in combinations of 2 or more in the form of a mixture.

Of the thermosetting resins, a polyamideimide resin is useful in view of good moisture resistance and also good adhesive strength to a metal. The raw material of a polyamideimide resin is not particularly limited and examples include, as an acid content, a trimellitic anhydride and trimellitic anhydride monochloride. The amine component is not particularly limited and examples include metaphenylene diamine, paraphenylene diamine, 4,4'-diaminodiphenylether, 4,4'-diaminodiphenylmethane, bis[4-(aminophenoxy)phenyl]sulfone and 2,2'-bis[4-(4-aminophenoxy)phenyl]propane. The polyamideimide resin may be siloxane-modified to enhance drying properties, and in this case siloxane diamine can be used as the amino component. For the polyamideimide resin, it is preferable to use those having a molecular weight of 50000 or more when film processability is considered. These polyamideimide resins may be used singly, or in combinations of 2 or more in the form of a mixture.

The polybutadiene is not particularly limited and examples include 1,4-polybutadiene, 1,2-polybutadiene, terminal (meth)acrylate-modified polybutadiene and terminal urethane methacrylate-modified polybutadiene. These polybutadienes may be used singly, or in combinations of 2 or more in the form of a mixture.

The thermosetting resins in the above were described as the insulation material mainly used for a prepreg but these thermosetting resins are not limited to the use as a prepreg. For example, a product obtained by preparing a film using the thermosetting resin described above (a film material) may be used as the first insulating resin layer of the support substrate for circuit formation.

A resin composition used as the insulation material may have an inorganic filler mixed in. The inorganic filler is not particularly limited and examples include alumina, aluminum hydroxide, magnesium hydroxide, clay, talc, antimony trioxide, antimony pentoxide, zinc oxide, fused silica, a glass powder, a quartz powder and a silas balloon. These inorganic fillers may be used singly, or in combinations of 2 or more in the form of a mixture.

A resin composition used as the insulation material may contain an organic solvent. The organic solvent is not particularly limited and examples include an aromatic hydrocarbon-based solvent such as benzene, toluene, xylene, and trimethylbenzene; a ketone-based solvent such as acetone, methyl ethyl ketone, methyl isobutyl ketone; an ether-based solvent such as tetrahydrofuran; an alcohol-based solvent such as isopropanol and butanol; an ether alcohol solvent such as 2-methoxyethanol and 2-butoxyethanol; and an amide-based solvent such as N-methylpyrrolidone, N,N-dimethylformamide and N,N-dimethylacetamide. These may be used singly, or in the form of a mixture if desired. The amount of the solvent in a varnish when producing a prepreg preferably ranges from 40 to 80 mass % based on the total resin composition. Further, a viscosity of the varnish preferably ranges from 20 to 100 cP (20 to 100 mPa·s).

A resin composition used as the insulation material may contain a flame retardant. The flame retardant is not particularly limited and a known conventional flame retardant can be used, including a bromine compound such as decabromodiphenyl ether, tetrabromobisphenol A, tetrabromophthalic anhydride and tribromophenol, a phosphorus compound such as triphenyl phosphate, trixylyl phosphate and cresyl diphenyl phosphate, a metal hydroxide such as magnesium hydroxide and aluminum hydroxide, red phosphorus and a modified product thereof, an antimony compound such as antimony trioxide and antimony pentoxide and a triazine compound such as melamine, cyanuric acid and melamine cyanurate. These flame retardants may be used singly, or in combinations of 2 or more in the form of a mixture.

Various additives and fillers such as the above curing agent and curing accelerator as needed, and additionally a thermoplastic particle, a coloring agent, a UV impermeant agent, an antioxidant and a reducing agent can further be added to the resin composition used as the insulation material. These additives and fillers may be used singly, or in combinations of 2 or more in the form of a mixture.

The prepreg of the present embodiment can be obtained in a semi-cured state (B stage state) by, for example, impregnating or coating the base material with the resin composition (including a varnish) in such a way that an amount of the resin composition adhered to the base material is 20 to 90 mass % in terms of a resin content in the dried prepreg, followed by drying with heating at a temperature of 100 to 200° C. for 1 to 30 minutes. A commercial product can also be used as such a prepreg and, for example, GHPL-830NS (product name) manufactured by MITSUBISHI GAS CHEMICAL COMPANY, INC. can be used. In the step (a) of the present embodiment, the following manner can be adopted for example: 1 to 20 sheets of such a prepreg are overlaid in such a way as to give an intended thickness of the insulating resin layer; and a copper foil such as a copper foil with a peel layer is disposed on both sides thereof so that the copper foil is in contact therewith, followed by heating and pressurizing the resulting configuration. For the molding method, a typical technique of copper clad laminates can be adopted and, for example, molding can be carried out using a multistage press, a multistage vacuum press, continuous molding or an autoclave molding machine, typically at a temperature of 100 to 250° C., a pressure of 2 to 100 kg/cm² and heating time ranging from 0.1 to 5 hours or can be carried out using a vacuum laminator under laminating conditions of 50 to 200° C. and 0.1 to 10 MPs on vacuum or atmospheric pressure condition. For the first insulating resin layer, a metal clad laminate commercialized as a copper clad laminate (CCL) and those obtained by removing a copper foil from the CCL can be used instead of the above.

The thickness of a first insulating resin layer is suitably determined as intended and not particularly limited but can be 0.02 mm to 2.0 mm, is preferably 0.03 mm to 0.2 mm and more preferably 0.04 mm to 0.15 mm.

(Peel Layer)

The support substrate for circuit formation of the present embodiment contains a peel layer. The peel layer preferably contains at least a silicon compound.

The "peel layer" preferably contains at least a silicon compound and means a layer which is positioned between the first insulating resin layer and the copper foil, wherein a peel strength (x) between the first insulating resin layer and the peel layer and a peel strength (y) between the copper foil and the first wire conductor at least has a relationship of x<y. The peel layer can contain a resin composition as needed in addition to a silicon compound. For the resin composition, for example, the thermosetting resins described above can be used. A peel strength (z) between the peel layer and the copper foil preferably has a relationship of x<z in relation to the peel strength (x), but not particularly limited thereto.

The silicon compound is not particularly limited and, for example, a silane compound represented by the following formula (1), a hydrolysis product thereof and a condensate of the hydrolysis product thereof (hereinafter, these are sometimes collectively referred to simply as "silane compounds") can be used. These silane compounds may be used singly, of in combinations of 2 or more in the form of a mixture. The peel layer can be formed by, for example, applying a single silane compound singly or a silicon compound composed of a plurality of silane compounds on a copper foil or an ultra-thin copper foil. The means for applying a silicon compound is not particularly limited and, for example, a known means such as coating can be used.

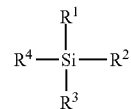

In the formula (1), $R^1$ represents an alkoxy group or a halogen atom, $R^2$ represents a hydrocarbon group selected from the group consisting of alkyl groups, cycloalkyl groups and aryl groups, $R^3$ and $R^4$ each independently represent a halogen atom, an alkoxy group, or a hydrocarbon group selected from the group consisting of alkyl groups, cycloalkyl groups and aryl groups. The hydrocarbon group has one or more hydrogen atoms optionally substituted with a halogen atom. $R^1$ to $R^4$ may each independently be the same or different.

The silane compound represented by the formula (1) preferably has at least one alkoxy group in view of preventing the firm adhesiveness to the copper foil from far too deteriorating. Further, from the same viewpoint, the silane compound represented by the formula (1) preferably has at least one hydrocarbon group selected from the group consisting of alkyl groups, cycloalkyl groups and aryl groups.

The silane compound represented by the formula (1), in view of adjusting the peel strength, particularly the peel strength (x), preferably has three alkoxy groups and one hydrocarbon group selected from the group consisting of alkyl groups, cycloalkyl groups and aryl groups. For example, in the formula (1), both $R^3$ and $R^4$ are preferably an alkoxy group.

The alkoxy group is not particularly limited and examples include a linear, branched, or cyclic alkoxy group having 1 to 20 carbon atoms, preferably 1 to 10 carbon atoms and more preferably 1 to 5 carbon atoms. Examples of the alkoxy group include a methoxy group, an ethoxy group, an n- or iso-propoxy group, an n-, iso- or tert-butoxy group, an n-, iso- or neo-pentoxy group, an n-hexoxy group, a cyclohexoxy group, an n-heptoxy group, and an n-octoxy group.

Examples of the halogen atom include a fluorine atom, a chlorine atom, a bromine atom and an iodine atom.

The alkyl group is not particularly limited and examples include a linear or branched alkyl group having 1 to 20 carbon atoms, preferably 1 to 10 carbon atoms and more preferably 1 to 5 carbon atoms. Examples of the alkyl group include a methyl group, an ethyl group, an n- or iso-propyl group, an n-, iso- or tert-butyl group, an n-, iso- or neo-pentyl group, an n-hexyl group, an n-octyl group and an n-decyl group.

The cycloalkyl group is not particularly limited and examples include a cycloalkyl group having 3 to 10 carbon atoms and preferably 5 to 7 carbon atoms. Examples of the cycloalkyl group include a cyclopropyl group, a cyclobutyl group, a cyclopentyl group, a cyclohexyl group, a cycloheptyl group and a cyclooctyl group.

The aryl group is not particularly limited and examples include an aryl group having 6 to 20 carbon atoms and preferably 6 to 14 carbon atoms. Examples of the aryl group include a phenyl group, a tolyl group, a phenyl group substituted with an alkyl group of a xylyl group, a 1- or 2-naphthyl group and an anthryl group.

The hydrocarbon group has one or more hydrogen atoms optionally substituted with a halogen atom and, for example, is optionally substituted with a fluorine atom, a chlorine atom or a bromine atom.

An example of the silane compound is not particularly limited but a compound other than the silicon compounds is preferable. Examples include methyltrimethoxysilane, dimethyldimethoxysilane, dimethyldiethoxysilane, ethyltrimethoxysilane, n- or iso-propyltrimethoxysilane, n-, iso- or tert-butyltrimethoxysilane, n-, iso- or neo-pentyltrimethoxysilane, hexyltrimethoxysilane, octyltrimethoxysilane, decyltrimethoxysilane and phenyltrimethoxysilane; alkyl-substituted phenyltrimethoxysilane (for example, p-(methyl)phenyltrimethoxysilane), methyltriethoxysilane, ethyltriethoxysilane, n- or iso-propyltriethoxysilane, n-, iso- or tert-butyltriethoxysilane, pentyltriethoxysilane, hexyltriethoxysilane, octyltriethoxysilane, decyltriethoxysilane, phenyltriethoxysilane, alkyl-substituted phenyltriethoxysilane (for example, p-(methyl)phenyltriethoxysilane), (3,3,3-trifluoropropyl)trimethoxysilane and tridecafluorooctyltriethoxysilane, methyltrichlorosilane, dimethyldichlorosilane, trimethylchlorosilane, phenyltrichlorosilane, trimethylfluorosilane, dimethyldibromosilane, diphenyldibromosilane, a hydrolysis product thereof and a condensate of the hydrolysis product thereof. Of these, in view of easy availability, dimethyldimethoxysilane, n-propyltrimethoxysilane, phenyltrimethoxysilane, hexyltrimethoxysilane, methyltriethoxysilane, dimethyldiethoxysilane, (3,3,3-trifluoropropyl)trimethoxysilane and dimethyldichlorosilane are preferable, and dimethyldimethoxysilane, n-propyltrimethoxysilane, methyltriethoxysilane, dimethyldiethoxysilane, (3,3,3-trifluoropropyl)trimethoxysilane and dimethyldichlorosilane are further preferable.

For those having peel layer formed on a copper foil or an ultra-thin copper foil using such a silane compound as the silicon compound, a commercial product may be used. For the commercial product, for example, those having a peel layer formed on a copper foil, the peel layer containing as the silicon compound at least one compound selected from the group consisting of dimethyldimethoxysilane, n-propyltrimethoxysilane, phenyltrimethoxysilane and hexyltrimethoxysilane, can be used and examples include "PCS" (product name) manufactured by JX Nippon Mining & Metals Corporation.

The peel strength (x) between the peel layer and the first insulating resin layer is not particularly limited and is preferably 3 to 20 N·m, more preferably 5 to 15 N·m and further preferably 8 to 12 N·m, in view of preventing the first insulating resin layer from being peeled in the steps before the peel step (e) while physically peeling the first insulating resin layer in the peel step (e) in the production method of the present embodiment. For example, when a peel strength (x) is within the above range, the first insulating resin layer is not peeled at the times of transporting and processing while easily physically peeled by human hand at the peel step (e).

Further, the difference (y−x) of a peel strength (y) and a peel strength (x) is not limited thereto, and for example, preferably 50 N·m or more, more preferably 100 N·m or more and further preferably 200 N·m or more, in view of preventing the copper foil from being peeled together at the time of peeling the first insulating resin layer at the peel step (e).

The peel strength (x) and/or the peel strength (y) can be adjusted to the above ranges by, for example, adjusting the kind of a silicon compound in a peel layer or the amount of a silicon compound applied for the peel strength (x), and adjusting press conditions, a plating thickness, materials, or conditions for a roughening treatment for the peel strength (y).

The thickness of a peel layer is not particularly limited and preferably 5 nm to 100 nm, more preferably 10 nm to 80 nm and further preferably 20 nm to 60 nm.

[Copper Foil]

The copper foil is not particularly limited but typically an ultra-thin copper foil having a thickness of 1 µm to 5 µm, preferably 2 µm to 4 µm and further preferably 2.5 µm to 3.5 µm. The copper foil is not particularly limited but has a ten-point mean roughness according to JISB0601:2001 (Rzjis) of preferably 0.3 µm to 3.0 µm, more preferably 0.5 µm to 2.0 µm and further preferably 0.7 µm to 1.5 µm, on both sides.

The copper foil can have a nodulous electrodeposited layer (also referred to as "burnt plating") formed thereon or can be subjected to a roughening treatment by an oxidation treatment, a reduction treatment, or etching. The production conditions of a copper foil are not particularly limited and in the case of a copper sulfate bath, the conditions of 50 to 100 g/L of sulfuric acid, 30 to 100 g/L of copper, a solution temperature at 20 to 80° C. and a current density of 0.5 to 100 A/dm$^2$, and in the case of a copper pyrophosphate bath, conditions of 100 to 700 g/L of potassium pyrophosphate, 10 to 50 g/L of copper, a solution temperature at 30 to 60° C., pH 8 to 12 and a current density of 0.5 to 10 A/dm$^2$ are generally commonly used. For a copper bath, various additives may be added in consideration of properties and smoothness of copper.

The copper foil can be formed using peelable type or using a copper foil having a specified thickness. The peelable type copper foil is a copper foil with a carrier, which can be, for example, peeled off. When a peelable type copper foil is used, the copper foil is used after peeling the carrier in the step (a).

A case where an ultra-thin copper foil is formed in the step (a) using a copper foil having a specified thickness is described. When an ultra-thin copper foil is formed using a copper foil having a specified thickness, a peel layer is first formed on the copper foil having a specified thickness to prepare the copper foil with the peel layer. The means for forming the peel layer on the copper foil is not particularly limited and, for example, the peel layer can be formed by applying the silicon compound described above on the copper foil by a known method such as coating. Further, a commercial product can also be used as the above copper foil with the peel layer and, for example, "PCS" (product name) manufactured by JX Nippon Mining & Metals Corporation described above can be used as the copper foil with the peel layer. The thickness of the copper foil having a specified thickness (that is, the copper foil part of the copper foil with the peel layer) is not particularly limited but preferably 1 µm or more and more preferably 1 µm to 20 µm, in view of removing unnecessary parts to an intended thickness (for example, 1 µm to 5 µm) by a thickness reduction means such as etching as needed. However, when a thickness of the copper foil having a specified thickness is 1 µm to 5 µm, there is a case where the treatment by a thickness reduction means is not required. A known method can be suitably adopted as the above thickness reduction means and examples include an etching treatment. The etching treatment is not particularly limited and, for example, etching can be carried out using a persulfate-based soft etching solution.

When an ultra-thin copper foil is formed using a copper foil having a specified thickness as described above, for example, a copper foil with a peel layer wherein the above peel layer is formed on a copper foil having a thickness of 1 μm to 20 μm can be used. Specifically, in the step (a), a copper foil with a peel layer wherein the peel layer is formed on a copper foil having a thickness of 1 μm to 20 μm is disposed on the first insulating resin layer in such a way that the peel layer and the first insulating resin layer are in contact, and subsequently through a step (a-1) in which an etching treatment is applied to the copper foil part of the copper foil with the peel layer to prepare the ultra-thin copper foil, thereby to form the ultra-thin copper foil from the copper foil having a specified thickness in the step (a). The production method of the present embodiment is not limited to the present aspect but, for example, when a 12 μm copper foil is used, a peel layer is formed by application and laminating-pressed to the first insulation resin layer, subsequently the copper foil is soft etched to adjust the thickness thereof to, for example, 3 μm to prepare a ultra-thin copper foil thereby to manufacture a support substrate for circuit formation. The etching treatment is not particularly limited and can be carried out after heating and pressurizing a copper foil with a peel layer to the first insulating resin layer.

Further, an anti-rust treatment can be applied to the adhesive surface of a peel layer of a copper foil (an anti-rust treatment layer is formed). The anti-rust treatment can be carried out using any of nickel, tin, zinc, chromium, molybdenum or cobalt or an alloy thereof. These are to form a thin film on a copper foil by sputtering, electroplating or electroless plating, with electroplating being preferable in view of cost. Specifically, plating is carried out using, as a plating layer, a chemical solution containing one or more metal salts selected from the group consisting of nickel, tin, zinc, chromium, molybdenum and cobalt. For easy deposition of metal ions, a complexing agent such as citrate, tartrate, or sulphamic acid is optionally added in a required amount to the plating solution. The plating solution is typically used in the acid region to carry out the plating at a temperature of room temperature to 80° C. Plating conditions are suitably selected from ranges of typically a current density of 0.1 to 10 A/dm$^2$, typically plating time of 1 to 60 seconds and preferably 1 to 30 seconds. An amount of a metal used for the anti-rust treatment varies depending on the kind of a metal and is not particularly limited, but is preferably 10 to 2000 μg/dm$^2$ in total. An anti-rust treatment layer that is too thick causes etching inhibition and deteriorated electrical properties, whereas an anti-rust treatment layer that is too thin may be a factor to deteriorate a peel strength to a resin.

A chromated layer further formed on the anti-rust treatment layer can control the adhesive intensity deterioration to a peel layer, which is useful. Specifically, chromation is carried out using an aqueous solution containing hexavalent chromium ion. The chromation is not particularly limited and can be carried out by, for example, a simple immersion treatment; however, it is preferably carried out by a cathode treatment. The cathode treatment is preferably carried out under the conditions of 0.1 to 50 g/L of sodium dichromate, pH 1 to 13, a bath temperature of 0 to 60° C., a current density of 0.1 to 5 A/dm$^2$ and current time of 0.1 to 100 seconds. The treatment can also be carried out using chromic acid or potassium dichromate in place of sodium dichromate.

In the present embodiment, it is preferable that a coupling agent be further adsorbed on the anti-rust treatment layer. The silane coupling agent is not particularly limited and, for example, an epoxy-functional silane such as 3-glycidoxypropyltrimethoxysilane or 2-(3,4-epoxycyclohexyl)ethyltrimethoxysilane, an amine-functional silane such as 3-aminopropyltrimethoxysilane, N-2-(aminoethyl)-3-aminopropyltrimethoxysilane or N-2-(aminoethyl)-3-aminopropylmethyldimethoxysilane, an olefin-functional silane such as vinyltrimethoxysilane, vinylphenyltrimethoxysilane or vinyltris(2-methoxyethoxy)silane, a (meth)acrylic-functional silane such as 3-(meth)acryloxypropyltrimethoxysilane or a mercapto-functional silane such as 3-mercaptopropyltrimethoxysilane is used. These silane coupling agents may be used singly, or in combinations of 2 or more in the form of a mixture. These coupling agents are adsorbed by being dissolved in a solvent such as water in a concentration of 0.1 to 15 g/L and applied to a metal foil at a temperature of room temperature to 50° C., or electrodeposited. These silane coupling agents form a film when bonded by condensation to the hydroxyl group of an antirust metal on the copper foil surface. After the silane coupling treatment, a stable bond is formed by heating or ultraviolet irradiation. For heating, the film is dried at a temperature of 80 to 200° C. for 2 to 60 seconds. The ultraviolet irradiation is carried out in a range from 200 to 400 nm or 200 to 2500 mJ/dm$^2$.

[Step (b)]

Step (b) is a step of forming a first wire conductor on the copper foil of the support substrate for circuit formation described above. When going through the step (b), a first wire conductor 5 is formed on a copper foil 4 of a support substrate for circuit formation 1 as shown in FIG. 1C. The forming means of the first wire conductor is not particularly limited and, for example, the first wire conductor can be formed by the following steps.

In the step (b), the following manner can be adopted, for example: a plating resist is laminated on the copper foil (step (b-1)), a wiring circuit pattern is formed on the plating resist by photolithography (step (b-2)), a first wire conductor is formed by pattern electrolytic copper plating on the copper foil on which the wiring circuit pattern has been formed (step (b-3)), and the plating resist is removed (step (b-4)) thereby to form the first wire conductor on the copper foil. In the step (b-2) of the above steps, the plating resist laminated on the copper foil is exposed and developed by photolithography whereby the wiring circuit patter can be formed on the plating resist. Subsequently, in the step (b-3), the copper foil on which the wiring circuit pattern has been formed on the plating resist is subjected to a pattern electrolytic copper plating treatment, thereby to form the first wire conductor by the plated copper. After the first wire conductor is formed, the plating resist is removed in the step (b-4).

The plating resist is not particularly limited and, for example, a known resist such as a commercial dry film resist can be suitably selected and used. Further, the photolithography (including exposure, development, and resist removal) at the time of forming the wiring circuit pattern on the plating resist is not particularly limited and can be carried out using a known means and apparatus. Further, the pattern electrolytic copper plating for forming the first wire conductor is also not particularly limited and a known method can be suitably used.

The pattern width of the first wire conductor is not particularly limited and can be suitably selected depending on the purpose of use but, for example, can be 5 to 100 μm and is preferably 10 to 30 μm.

[Step (c)]

The step (c) is a step of laminating a second insulating resin layer, by disposing the second insulating resin layer in such a way that the second insulating resin layer is in contact with the first wire conductor; and heating and applying a pressure on the second insulating resin layer. The step (c) may be a step of laminating the second insulating resin layer and the metal layer by further disposing a metal layer on the second insulating resin layer followed by heating and applying a pressure. When going through the step (c), as shown in FIG. 1D, a second insulating resin layer 6 can be laminated in such a way as to contact the first wire conductor 5 and a metal layer 7 can be laminated thereon. FIG. 1D shows an embodiment in which metal layers is provided but the present invention is not limited to such an embodiment.

For the second insulating resin layer, the same materials as the first insulating resin layer described above (for example, a prepreg) can be used. Further, the thickness of the second insulating resin layer is suitably set as intended and not particularly limited but can be, for example, 0.02 mm to 2.0 mm, is preferably 0.03 mm to 0.2 mm and more preferably 0.04 mm to 0.15 mm.

For the metal layer, for example, those as described above in the copper foil can be used. For the copper foil, for example, an ultra-thin copper foil with a carrier copper foil can be used. In this case, the carrier is disposed in such a way that the ultra-thin copper foil is in contact with the second insulating resin layer, laminated by heating and applying a pressure and subsequently peeled. For the ultra-thin copper foil with a carrier copper foil, a commercial product can also be used and, for example, MTEx (product name) manufactured by Mitsui Mining & Smelting Co., Ltd. can be used.

For the second insulating resin layer, a commercial product can also be used and, for example, CRS-381 NSI (product name) manufactured by MITSUBISHI GAS CHEMICAL COMPANY, INC. can be used.

The heating and pressure applying conditions for the second insulating resin layer and the metal layer are not particularly limited and, for example, vacuum press is carried out under the conditions at a temperature of 220±2° C., a pressure of 2.5±0.2 MPa and for a hold time of 60 minutes to laminate the second insulating resin layer and the metal layer.

The step (c) is not particularly limited and, for example, a second insulating resin layer and a metal layer can be laminated by the following steps. In the step (c), the following manner can be adopted, for example: the first wire conductor surface is subjected to a roughening treatment to obtain a firm adhesive strength to a second insulating resin layer (step (c-1)); the second insulating resin layer is disposed in such a way as to contact the first wire conductor that has been subjected to the roughening treatment, a metal layer is further disposed on the second insulating resin layer, and heating and applying a pressure are carried out thereon, thereby to laminate the second insulating resin layer and the metal layer (step (c-2)). The roughening treatment is not particularly limited and a known means can be suitably used. Examples include a means which uses a copper surface roughening solution.

[Step (d)]

The step (d) is a step of drilling a non-through hole reaching the first wire conductor in the second insulating resin layer; and connecting an inner wall of the non-through hole by electro copper plating and/or electroless copper plating; and forming a second wire conductor. In the second wire conductor formation step (d), as shown in FIG. 1E, a first wire conductor 5 and a metal layer 7 are electrically connected through the plated copper formed on the inner wall of the non-through hole by electro copper plating and/or electroless copper plating. Subsequently, as shown in FIG. 1F, a second wire conductor 8 can be formed on a second insulating resin layer 6 by patterning the metal layer 7.

The means for drilling the non-through hole is not particularly limited and, for example, a known means such as a laser such as a carbon dioxide laser and a drill can be used. The non-through hole is drilled in the second insulating resin layer through a metal layer and provided to electrically connect the second wire conductor formed in the present step and the first wire conductor. The number and size of the non-through hole can be suitably selected as intended. Further, after the non-through hole is drilled, a desmear treatment can be carried out using a sodium permanganate aqueous solution.

In the step (d), after the non-through hole is drilled, electro copper plating and/or electroless copper plating is applied to form a copper plating film on the inner wall of the non-through hole thereby to electrically connect the first wire conductor and the second wire conductor. The method for applying the electro copper plating and/or electroless copper plating is not particularly limited and a known method can be employed. The copper plating may be either electro copper plating or electroless copper plating, but it is preferable to apply both electro copper plating and electroless copper plating.

The step (d) forms a second wire conductor after the electro and/or electroless copper plating treatment. The method for forming the second wire conductor is not particularly limited and, for example, a known means such as a subtractive method and a semi-additive method can be suitably employed.

The step (d) is not particularly limited and, for example, the non-through hole reaching the first wire conductor is drilled in the second insulating resin layer (step (d-1)), the inner wall of the non-through hole is connected by electro copper plating and/or electroless copper plating (step (d-2)), thereby to form a second wire conductor by a subtractive method or a semi-additive method (step (d-3)). The step (d-3) is not particularly limited. In the step (d-3), for example, a surface treatment of a metal layer is carried out, a dry film resist is laminated, further a negative mask is attached thereto, subsequently a circuit pattern is exposed using an exposure equipment and the dry film resist is developed using a developer, thereby to form an etching resist. Then, an etching treatment is applied, and parts of the copper which are uncovered with the etching resist are removed using a ferric chloride aqueous solution, followed by removing the resist, thereby to form the second wire conductor.

Other interlayer connection methods applicable in the present embodiment include a known method in which chemical copper plating is applied to laser-formed blind via parts (a method including forming a wiring circuit by a laser processing, and subsequently carrying out patterning and interlayer connection by chemical copper plating), a method for achieving the interlayer connection by penetrating through insulating layers with metal bumps (preferably copper bumps) formed in advance by plating or etching a metal foil at parts which are to be connection parts, and a method in which a solder or a metal paste containing a metal filler such as silver and copper in an insulating resin is bump printed at predetermined parts by screen printing, the paste is cured by drying, and heating and applying a pressure are carried out on the resultant thereby to ensure the electrical continuity through the inner and outer layers.

[Step (e)]

The step (e) is a step of peeling the first insulating resin layer from the circuit formation substrate on which the first and the second wire conductors are formed. When going through the step (e), as shown in FIG. 1G, a first insulating resin layer is peeled at the interface of a peel layer 3, thereby to form a laminate wherein a first wire conductor 5, a second insulating resin layer 6 and a second wire conductor 8 are laminated on the peel layer 3 and a copper foil 4.

In the step (e), it is preferable for the first insulating resin layer to be peeled at the interface between the first insulating resin layer and the peel layer but, for example, a part of the peel layer may be peeled together with the first insulating resin layer. Further, a mode is also included in which the first insulating resin layer is peeled together with the peel layer at the interface between the peel layer and the copper foil. For the means for peeling the first insulating resin layer, a physical means and a chemical means can be both employed but, for example, it is preferable that a physical force be applied to the peel layer to physically peel off the first insulating resin layer.

[Step (f)]

The step (f) is a step of removing the peel layer 3 and the copper foil 4 from the circuit formation substrate. When going through the step (f), as shown in FIG. 1H, a circuit formation substrate for loading a semiconductor device 10, wherein a first wire conductor 5 (inner layer) is buried in a second insulating resin layer 6 and the first wire conductor 5 (inner layer) and a second wire conductor 8 (outer layer) are electrically joined, can be formed. In the step (f), for example, the peel layer and/or the copper foil (preferably, an ultra-thin copper foil) can be removed using a sulfuric acid-based or a hydrogen peroxide-based etching solution. For example, in the step (e), when the first insulating resin layer is peeled at the interface of the peel layer, and when the peel layer is ruptured and a part thereof is peeled together with the first insulating resin layer, the entire peel layer or a part thereof and the copper foil are removed in the removing step (f). Further, in the step (e), when the first insulating resin layer is peeled together with the peel layer at the interface between the peel layer and the copper foil, only the copper foil is removed in the removing step (f). The sulfuric acid-based or hydrogen peroxide-based etching solution is not particularly limited, and those which have been used in the pertinent industries can be suitably selected and used.

Figure 2:
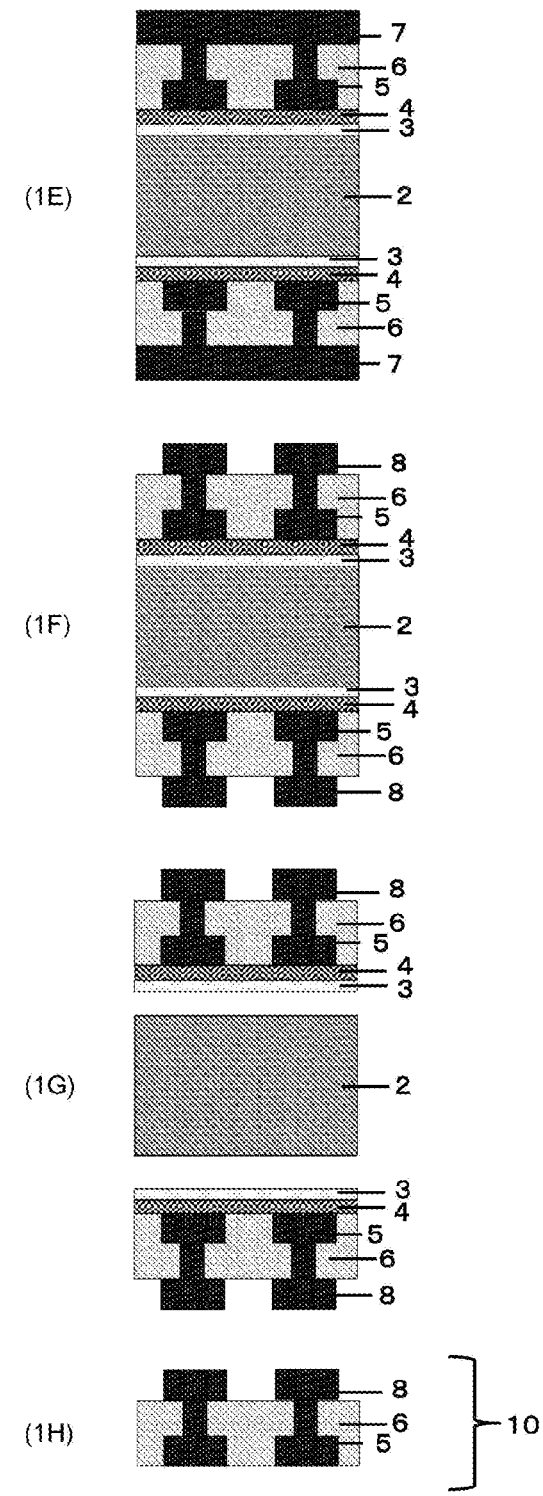
FIG. 2 is drawings (FIG. 1E to FIG. 1H) schematically showing the production method of Embodiment 1.
Figure 3:
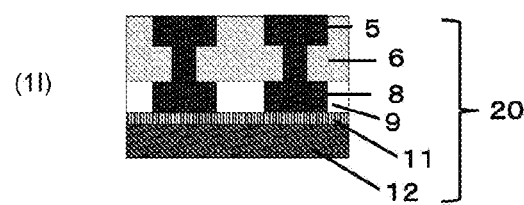
FIG. 3 is drawings (FIG. 1I to FIG. 1K) schematically showing the production method of Embodiment 1.
Figure 3:
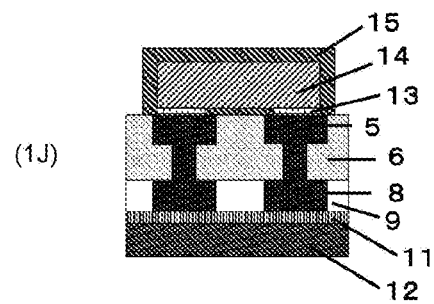
Figure 3:
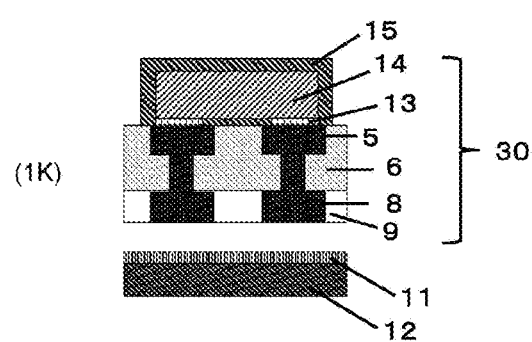
Figure 4:
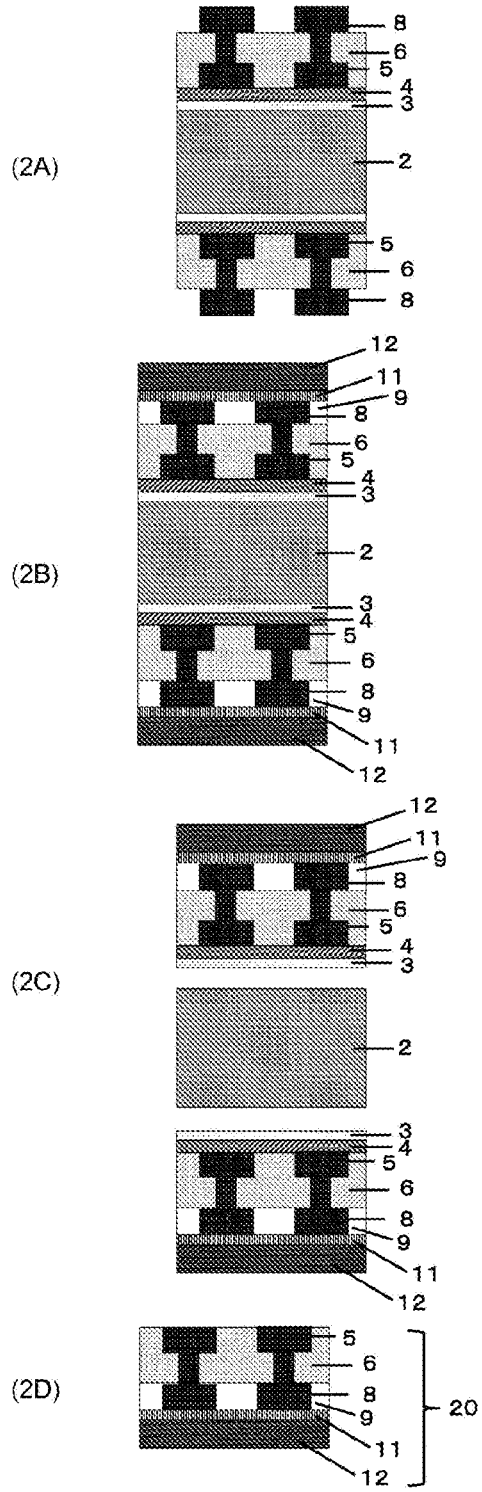
FIG. 4 is drawings (FIG. 2A to FIG. 2D) schematically showing the production method of Embodiment 2.

In FIGS. 1 and 2 explaining the present embodiment with examples, the circuit formation substrate 10 is a 2-layer structured package substrate for loading a semiconductor device. The present embodiment is not limited thereto and package substrates for loading a semiconductor device having a build-up structure of 3 or more-layer structure (3-layer structure, 4-layer structure, . . . n-layer structure) can be formed. More specifically, the method for producing the semiconductor device-mounting substrate of the present embodiment may further include a step of forming a build-up structure by repeatedly carrying out an insulating resin layer lamination step and a wire conductor formation step between the step (d) and the step (e) on the circuit formation substrate on which the first and the second wire conductors are formed. The insulating resin layer lamination step and the wire conductor formation step herein are carried out by the same procedures as the step (c) and the step (d), respectively.

The method for producing the semiconductor device-mounting substrate of the present embodiment may further include a step of forming a solder resist layer to the circuit formation substrate on which the second wire conductor is formed. This step, for example, may be carried out between the step (d) and the step (e), or between the step (f) and a step (g) to be described later. The solder resist layer is not particularly limited and, for example, can be formed using a laminator or a hot press.

[Step (g)]

The step (g) is a step of laminating the support described above on the circuit formation substrate by pressing. Specifically, a heat resistant film layer 11 of the support is disposed in such a way as to contact the surface of the circuit formation substrate on which a second wire conductor 8 is formed and subsequently pressed. When going through the step (g), as shown in FIG. 1I, a laminate 20 is formed wherein the support is laminated on the surface of the circuit formation substrate on which the second wire conductor is formed. The view shown in FIG. 1I shows the laminate when a solder resist layer 9 is formed by applying a solder resist on one side of a circuit formation substrate, subsequently laminating a support by pressing; however, a structure wherein solder resist layers are formed on both sides of a circuit formation substrate or a structure without the solder resist layer 9 which is prepared by carrying out the step (g) directly from the step (f) may be used.

The method for pressing the support is not particularly limited. For example, a heat resistant film layer of the support is disposed in such a way as to contact the surface of the circuit formation substrate on which the second wire conductor is formed and subsequently vacuum press is carried out under the conditions at a temperature 120 to 200° C., a pressure of 1 to 4 MPa and for a hold time of 30 to 120 minutes.

[Step (h)]

The step (h) is a step of mounting a semiconductor device on the wire conductors of the circuit formation substrate. When going through the step (h), as shown in FIG. 1J, a laminate having a semiconductor device mounted is formed. In FIG. 1J, a bare chip 14 is mounted via solder balls 13 on the first wire conductor and further resin-sealed by a mold resin 15.

In the step (h), the semiconductor device can be mounted on the wire conductors via a joining material. Typically, before mounting the semiconductor device herein, a solder resist layer having openings is formed on the wire conductors, followed by forming a gold-plated layer in the openings, and the joining material is further loaded on the gold-plated layer, followed by carrying out reflow at about 260° C., thereby to manufacture a multilayer printed wiring board with the joining material formed. The gold-plated layer is not particularly limited and, for example, can be formed by electrolysis, electroless, or a paste. The joining material is not particularly limited as long as it has a conductive means and, for example, a solder (for example, a solder ball and a solder paste) can be used. When a solder is used as the joining material, a treatment such as reflow can be applied after a semiconductor device is mounted on the wire conductors. At this time, the reflow temperature is suitably selected depending on a melting point of the joining material or the like but, for example, is preferably 260° C. or more.

The semiconductor device is not particularly limited. An intended device can be suitably used but, for example, a bare chip with gold bumps formed on an aluminum electrode part by a ball bonding method using gold wires can be used.

For the mold resin, a known resin used for the purpose of being a sealing material can be suitably selected and used.

As described above, typically, before mounting a semiconductor device, a step of forming a solder resist layer having openings on the wire conductors and subsequently forming a gold-plated layer in the openings is carried out but these steps, for example, may be carried out between the step (d) and the step (e) or between the step (f) and the step (g).

[Step (i)]

The step (i) is a step of peeling the support from the circuit formation substrate. When going through the step (i), as shown in FIG. 1K, a support is peeled from a laminate having a semiconductor device mounted, thereby to obtain a semiconductor device-mounting substrate 30. For the means for peeling the support, a physical means and a chemical means can be both employed but, for example, it is preferable that a physical force be applied to the heat resistant film layer to physically peel off the support.

Embodiment 2

A method for producing the semiconductor device-mounting substrate of the second embodiment (Embodiment 2) for carrying out the present invention contains the following steps.

(a) a step of forming a support substrate for circuit formation including a first insulating resin layer, a peel layer and a copper foil in this order, (b) a step of forming a first wire conductor on the copper foil of the support substrate for circuit formation, (c) a step of laminating a second insulating resin layer, by disposing the second insulating resin layer in such a way that the second insulating resin layer is in contact with the first wire conductor; and heating and applying a pressure on the second insulating resin layer, (d) a step of drilling a non-through hole reaching the first wire conductor in the second insulating resin layer; and connecting an inner wall of the non-through hole by electro copper plating and/or electroless copper plating; and forming a second wire conductor, (j) a step of laminating the support by pressing the support on the circuit formation substrate on which the first and the second wire conductors are formed, (k) a step of peeling the first insulating resin layer from the circuit formation substrate on which the support is laminated, (l) a step of removing the peel layer and/or the copper foil from the circuit formation substrate, (h) a step of mounting a semiconductor device on the wire conductors of the circuit formation substrate, and (i) a step of peeling the support from the circuit formation substrate.

The steps (a) to (d), (h), and (i) herein are the same as each of the steps in Embodiment 1 described above and hence the descriptions are left out.

As in Embodiment 1, package substrates for loading a semiconductor device having a build-up structure of 3 or more-layer structure (3-layer structure, 4-layer structure, . . . n-layer structure) can be formed in Embodiment 2. More specifically, the production method may further include a step of forming a build-up structure by repeatedly carrying out an insulating resin layer lamination step and a wire conductor formation step between the step (d) and the step (e) on the circuit formation substrate on which the first and the second wire conductors are formed.

[Step (j)]

The step (j) is a step of laminating the support by pressing the support on the circuit formation substrate on which the first and the second wire conductors are formed (FIG. 2A). Specifically, a heat resistant film layer 11 of the support is disposed in such a way as to contact the surface of the circuit formation substrate on which a second wire conduct 8 is formed and subsequently pressed. When going through the step (j), as shown in FIG. 2B, a laminate is formed wherein the support is laminated on the surface of the circuit formation substrate on which a second wire conductor is formed. The view shown in FIG. 2B shows the laminate when a solder resist layer 9 is formed by applying a solder resist on a circuit formation substrate and subsequently laminating the support by pressing, however, the step (j) may be carried out directly from the step (d) without forming the solder resist layer. The method for forming a solder resist layer is as described above.

The method for pressing the support is the same as the step (g) described above.

[Step (k)]

The step (k) is a step of peeling the first insulating resin layer from the circuit formation substrate on which the support is laminated. When going through the step (k), as shown in FIG. 2C, a first insulating resin layer is peeled at the interface of a peel layer 3, thereby to form a laminate wherein a first wire conductor 5, a second insulating resin layer 6 and a second wire conductor 8 are laminated on the peel layer 3 and a copper foil 4 and the support is laminated on the surface on which the second wire conductor is formed.

In the step (k), it is preferable for the first insulating resin layer to be peeled at the interface between the first insulating resin layer and the peel layer but, for example, a part of the peel layer may be peeled together with the first insulating resin layer. Further, a mode is also included in which the first insulating resin layer is peeled together with the peel layer at the interface between the peel layer and the copper foil. For the means for peeling the first insulating resin layer, a physical means and a chemical means can be both employed but, for example, it is preferable that a physical force be applied to the peel layer to physically peel off the first insulating resin layer.

[Step (l)]

The step (l) is a step of removing the peel layer and/or the copper foil from the circuit formation substrate. When going through the step (l), as shown in FIG. 2D, a laminate 20 can be formed wherein the support is laminated on a circuit formation substrate for loading a semiconductor device in which a first wire conductor 5 (inner layer) is buried in a second insulating resin layer 6 and the first wire conductor 5 (inner layer) and a second wire conductor 8 (outer layer) are electrically joined. In the step (l), for example, the peel layer and/or the ultra-thin copper foil can be removed using a sulfuric acid-based or a hydrogen peroxide-based etching solution. For example, in the step (k), when the first insulating resin layer is peeled at the interface of the peel layer, and when the peel layer is ruptured and a part thereof is peeled together with the first insulating resin layer, the entire peel layer or a part thereof and the copper foil are removed in the removing step (l). Further, in the step (k), when the first insulating resin layer is peeled together with the peel layer at the interface between the peel layer and the copper foil, only the copper foil is removed in the removing step (l). The sulfuric acid-based or hydrogen peroxide-based etching solution is not particularly limited, and those which have been used in the pertinent industries can be suitably selected and used.

As described above, typically, before mounting a semiconductor device, a step of forming a solder resist layer having openings on the wire conductors and subsequently forming a gold-plated layer in the openings is carried out but these steps, for example, may be carried out between the step (l) and the step (h).

Hereinabove, Embodiment 1 and Embodiment 2 of the method for producing the semiconductor device-mounting substrate of the present embodiment have been described. Embodiment 1 is more preferable than Embodiment 2 in view of being capable of carrying out an electrical test using a circuit formation substrate before pressing the support thereonto.

The present invention is not limited to these embodiments and encompasses other embodiments in addition to Embodiment 1 and Embodiment 2.

EXAMPLE

Hereinafter, the present embodiments are specifically described in reference to examples but are not limited to these examples.

Example 1

<Manufacture of a Support>

On one side of a prepreg of B stage in which a glass cloth (glass fiber) was impregnated with a bismaleimide triazine resin (BT resin) (thickness 0.100 mm: manufactured by MITSUBISHI GAS CHEMICAL COMPANY, INC., product name: GHPL-830NS ST56), a polyimide film having a thickness of 27 μm with an adhesive layer (thickness of the adhesive layer: 15 μm, manufactured by NIKKAN INDUSTRIES Co., Ltd., product name: CISV) was disposed in such a way that the adhesive layer surface was in contact with the insulating resin layer. A copper foil having a thickness of 18 μm (manufactured by Mitsui Mining & Smelting Co., Ltd., product name: 3EC-VLP) was disposed on the other side, and then vacuum press was carried out under the conditions at a temperature of 80±2° C., a pressure of 1.0±0.2 MPa and for a hold time of 3 minutes thereby to manufacture a support (a) (thickness 145 μm).

<Step (a)>

On both sides of a prepreg of B stage in which a glass cloth (glass fiber) was impregnated with a bismaleimide triazine resin (BT resin) (thickness 0.100 mm: manufactured by MITSUBISHI GAS CHEMICAL COMPANY, INC., product name: GHPL-830NS ST56), a copper foil with a peel layer (manufactured by JX Nippon Mining & Metals Corporation, product name: PCS) in which a peel layer formed of a silane compound on the copper foil having a thickness of 12 μm was formed by application was disposed in such a way that the peel layer surface was in contact with the prepreg, and then vacuum press was carried out under the conditions at a temperature of 220±2° C., a pressure of 5±0.2 MPa and for a hold time of 60 minutes. Subsequently, a thickness of the copper foil was adjusted to 3 μm by etching using a persulfate-based soft etching solution, thereby to manufacture a support substrate for circuit formation wherein the peel layer and the copper foil were provided in this order on both sides of the first insulating resin layer.

<Step (b)>

Guide holes were drilled in the support substrate for circuit formation using a Hitachi Viamechanics's router processor, and then 1 to 2 μm of the surface was etched using a persulfate-based soft etching solution. Subsequently, a dry film resist NIT225 (manufactured by Nichigo Morton Co., Ltd., product name) was laminated under the conditions at a temperature of 110±10° C. and a pressure of 0.50±0.02 MPa. Exposure of a circuit pattern to the dry film resist was carried out using a parallel exposure device with the guide holes as references, and then the dry film resist was developed using a 1% sodium carbonate aqueous solution to form a resist pattern for plating. Subsequently, a pattern electrolytic copper plating of about 15 to 20 μm was applied at a copper sulfate plating line having a copper sulfate concentration of 60 to 80 g/L and a sulfuric acid concentration of 150 to 200 g/L thereby to form a first wire conductor. Then, the dry film resist was peeled and removed using an amine-based resist stripping solution.

<Step (c)>

For achieving a firm adhesive strength to the insulating resin, the first wire conductor (copper pattern) surface was subjected to a roughening treatment using a copper surface roughening solution CZ-8100 (manufactured by MEC Co., Ltd., product name). Subsequently, on both sides of the support substrate for circuit formation on which the first wire conductor was formed, a prepreg (thickness 0.100 mm: manufactured by MITSUBISHI GAS CHEMICAL COMPANY, INC., product name: GHPL-830NS ST56) in which a bismaleimide triazine resin (BT resin) was impregnated in a glass cloth (glass fiber) to be B stage was disposed. Subsequently, an ultra-thin copper foil with a carrier copper foil having a thickness of 18 μm (ultra-thin copper foil (metal layer); thickness 2 μm: manufactured by Mitsui Mining & Smelting Co., Ltd., product name: MTEx) was disposed on the prepreg in such a way that the carrier copper foil side was in contact with the prepreg and vacuum-pressed under the conditions at a pressure of 2.5±0.2 MPa, a temperature of 220±2° C. and for a hold time of 60 minutes. Then, the carrier copper foil having a thickness of 18 μm was peeled, thereby to obtain a support substrate for circuit formation wherein the second insulating resin layer and the ultra-thin copper foil having a thickness of 2 μm were laminated on the first wire conductor.

<Step (d)>

Into both sides of the support substrate for circuit formation wherein the second insulating resin layer and the metal layer were laminated on the first wire conductor, each hole was processed using a carbon dioxide laser processor LC-1C/21 (manufactured by Hitachi Viamechanics, product name) under the conditions of a beam irradiation diameter of ϕ 0.21 mm, a frequency of 500 Hz, a pulse width of 10 μs and the number of irradiations of 7 shots, thereby to drill non-through holes reaching the first wire conductor in the second insulating resin layer via the metal layer.

Subsequently, to the support substrate for circuit formation in which the non-through holes were drilled, a desmear treatment was carried out using a sodium permanganate aqueous solution in a concentration of 55 t 10 g/L at a temperature of 80±5° C., further plating was carried out to a thickness of 0.4 to 0.8 μm by electroless copper plating, and subsequently plating was carried out to a thickness of 15 to 20 μm by electro copper plating. By this procedure, the inner walls of the non-through holes were connected by the platings, whereby the first wire conductor (inner layer) and the metal layer (outer layer) were supposed to have been electrically connected by the platings on the non-through hole inner walls.

Subsequently, a surface treatment of the substrate surface (metal layer) was carried out under the conditions at a temperature of 110±10° C. and a pressure of 0.50±0.02 MPa and a dry film resist NIT225 (manufactured by Nichigo Morton Co., Ltd., product name) was laminated. Then, a negative mask was attached thereto, subsequently a circuit pattern was exposed using a parallel exposure device, the dry film resist was developed using a 1% sodium carbonate aqueous solution, thereby to form an etching resist. Then, parts of the copper which were uncovered with the etching resist were removed using a ferric chloride aqueous solution, followed by removing the dry film resist using a sodium hydroxide aqueous solution, thereby to form a second wire conductor.

<Step (e)>

After forming the second wire conductor, a physical force was applied to the interface part between the copper foil with the peel layer and the first insulating resin layer (prepreg layer) to peel off the first insulating resin layer (prepreg layer) from the support substrate for circuit formation on which the first wire conductor and the second wire conductor were formed, thereby to prepare a set of laminate.

<Step (f)>

After the first insulating resin layer (prepreg layer) was peeled off in the peel step (e), the ultra-thin copper foil and the peel layer were removed using a persulfate-based soft etching solution. Then, a solder resist of 10 μm was formed and a gold-plating finish was carried out.

<Step (g)>

One side of the circuit formation substrate on which the solder resist of 10 μm was formed and the gold-plating finish was carried out in the removing step (f) was disposed in such a way as to contact the polyimide layer of the support (a), and vacuum press was carried out under the conditions at a temperature of 160±2° C., a pressure of 3.0±0.2 MPa and for a hold time of 60 minutes, thereby to manufacture a laminate.

<Step (h) and Step (i)>

The laminate obtained in the step (g) was cut to a package size thereby to obtain a package substrate for loading a semiconductor device. Subsequently, solder balls were loaded on the gold-plated layer to carry out reflow at about 260° C. thereby to manufacture a multilayer printed wiring board on which the solder balls were formed. Subsequently, the obtained multilayer printed wiring board and a bare chip with gold bumps formed on an aluminum electrode part by a ball bonding method using gold wires were aligned and the bare chip was loaded on the multilayer printed wiring board. Then, the multilayer printed wiring board on which the bare chip was loaded was solder-connected by reflowing at about 260° C., washed and resin-sealed using a mold resin. Subsequently, a physical force was applied at the interface part between the solder resist layer and the polyimide layer to peel off the support (a) from the multilayer printed wiring board, thereby to manufacture a semiconductor device-mounting substrate.

Example 2

<Step (c)>

The step (a) and the step (b) of Example 1 were carried out and first wire conductor (copper pattern) surface was subjected to a roughening treatment using a copper surface roughening solution CZ-8100 (manufactured by MEC Co., Ltd., product name) to achieve a firm adhesive strength to the insulating resin layer. Subsequently, on both sides of the support substrate for circuit formation on which the first wire conductor was formed, a copper foil with a resin (thickness 15 μm: manufactured by MITSUBISHI GAS CHEMICAL COMPANY, INC., product name: CRS-381 NSI), in which a bismaleimide triazine resin (BT resin) was applied to an ultra-thin copper foil (ultra-thin copper foil (metal layer); thickness 2 μm: manufactured by Mitsui Mining & Smelting Co., Ltd., product name: MTEx) with a carrier copper foil having a thickness of 18 μm to be B stage, was disposed and vacuum-pressed under the conditions at a pressure of 2.5±0.2 MPa, a temperature of 220±2° C. and for a hold time of 60 minutes. Subsequently, the carrier copper foil having a thickness of 18 μm was peeled off, thereby to obtain a support substrate for circuit formation in which the second insulating resin layer and the ultra-thin copper foil having a thickness of 2 μm were laminated on the first wire conductor.

<Step (d)>

Into both sides of the support substrate for circuit formation wherein the second insulating resin layer and the metal layer were laminated on the first wire conductor, each hole was processed using a carbon dioxide laser processor LC-1C/21 (manufactured by Hitachi Viamechanics, product name) under the conditions of a beam irradiation diameter of φ 0.21 mm, a frequency of 500 Hz, a pulse width of 10 μs and the number of irradiations of 7 shots, thereby to drill non-through holes reaching the first wire conductor in the second insulating resin layer via the metal layer.

Subsequently, to the support substrate for circuit formation in which the non-through holes were drilled, a desmear treatment was carried out using a sodium permanganate aqueous solution in a concentration of 55±10 g/L at a temperature of 80±5° C., further plating was carried out to a thickness of 0.4 to 0.8 μm by electroless copper plating, and subsequently plating was carried out to a thickness of 15 to 20 μm by electro copper plating. By this procedure, the inner walls of the non-through holes were connected by the platings, whereby the first wire conductor (inner layer) and the metal layer (outer layer) were supposed to have been electrically connected by the platings on the non-through hole inner walls.

Subsequently, a surface treatment of the substrate surface (metal layer) was carried out under the conditions at a temperature of 110±10° C. and a pressure of 0.50±0.02 MPa and a dry film resist NIT225 (manufactured by Nichigo Morton Co., Ltd., product name) was laminated. Then, a negative mask was attached thereto, subsequently a circuit pattern was exposed using a parallel exposure device, subsequently the dry film resist was developed using a 1% sodium carbonate aqueous solution, thereby to form an etching resist. Then, parts of the copper which were uncovered with the etching resist were removed using a ferric chloride aqueous solution, followed by removing the dry film resist using a sodium hydroxide aqueous solution, thereby to form a second wire conductor.

<Step (e)>

After forming the second wire conductor, a solder resist of 10 μm was formed on the second wire conductor, a physical force was applied to the interface part between the copper foil with the peel layer and the first insulating resin layer (prepreg layer) to peel off the first insulating resin layer (prepreg layer) from the support substrate for circuit formation on which the first wire conductor and the second wire conductor were formed, thereby to prepare a set of laminate.

<Step (f)>

After the first insulating resin layer (prepreg layer) was peeled off in the peel step (e), the ultra-thin copper foil and the peel layer were removed using a persulfate-based soft etching solution. Then, a solder resist of 10 μm was formed and a gold-plating finish was carried out.

<Step (g)>

One side of the circuit formation substrate on which the solder resist of 10 μm was formed and the gold-plating finish was carried out in the removing step (f) was disposed in such a way as to contact the polyimide part of the support (a), and vacuum press was carried out under the conditions at a temperature of 160±2° C., a pressure of 3.0±0.2 MPa and for a hold time of 60 minutes, thereby to manufacture a laminate.

<Step (h) and Step (i)>

The laminate obtained in the step (g) was cut to a package size thereby to obtain a package substrate for loading a semiconductor device. Subsequently, solder balls were loaded on the gold-plated layer to carry out reflow at about 260° C. thereby to manufacture a multilayer printed wiring board on which the solder balls were formed. Subsequently, the obtained multilayer printed wiring board and a bare chip with gold bumps formed on an aluminum electrode part by a ball bonding method using gold wires were aligned and the bare chip was loaded on the multilayer printed wiring board. Then, the multilayer printed wiring board on which the bare chip was loaded was solder-connected by reflowing at about 260° C., washed and resin-sealed using a mold resin. Subsequently, a physical force was applied at the interface part between the solder resist layer and the polyimide layer to peel off the support (a) from the multilayer printed wiring board, thereby to manufacture a semiconductor device-mounting substrate.

Example 3

<Step (j)>

The step (a) to the step (d) of Example 2 were sequentially carried out, a solder resist of 10 μm was formed on the second wire conductor and a gold-plating finish was carried out. Subsequently, one side of the support substrate for circuit formation was disposed in such a way as to contact the polyimide part of the support (a), and vacuum press was carried out under the conditions at a temperature of 160±2° C., a pressure of 3.0±0.2 MPa and for a hold time of 60 minutes, thereby to manufacture a laminate.

<Steps (k) and (l)>

After the first insulating resin layer (prepreg layer) was peeled off from the laminate in the peel step, the ultra-thin copper foil and the peel layer were removed using a persulfate-based soft etching solution. Subsequently, a solder resist of 10 μm was formed.

<Step (h) and Step (i)>

The laminate obtained in the step (l) was cut to a package size thereby to obtain a package substrate for loading a semiconductor device. Subsequently, solder balls were loaded on the gold-plated layer to carry out reflow at about 260° C. thereby to manufacture a multilayer printed wiring board on which the solder balls were formed. Subsequently, the obtained multilayer printed wiring board and a bare chip with gold bumps formed on an aluminum electrode part by a ball bonding method using gold wires were aligned and the bare chip was loaded on the multilayer printed wiring board. Then, the multilayer printed wiring board on which the bare chip was loaded was solder-connected by reflowing at about 260° C., washed and resin-sealed using a mold resin. Subsequently, a physical force was applied at the interface part between the solder resist layer and the polyimide layer to peel off the support (a) from the multilayer printed wiring board, thereby to manufacture a semiconductor device-mounting substrate.

Comparative Example 1

The step (a) to the step (f), the step (h) and the step (i) of Example 1 were sequentially carried out without using the support (a) to manufacture a package substrate for loading a semiconductor device (thickness 60 μm). Subsequently, solder balls were loaded on the gold-plated layer and reflow was carried out at about 260° C., however, the substrate being thin with small stiffness was broken.

The present application was based on a Japanese Patent Application (Patent Application No. 2017-088834) filed on Apr. 27, 2017 and the contents thereof are incorporated herein by reference.

INDUSTRIAL APPLICABILITY

The supports of the present embodiments have industrial applicability as a support of a package substrate for loading a semiconductor device when producing a semiconductor device-mounting substrate.

REFERENCE SIGNS LIST

1 . . . Support substrate for circuit formation
2 . . . First insulating resin layer
3 . . . Peel layer
4 . . . Copper foil
5 . . . First wire conductor
6 . . . Second insulating resin layer
7 . . . Metal layer
8 . . . Second wire conductor
9 . . . Solder resist layer
10 . . . Circuit formation substrate
11 . . . Heat resistant film layer
12 . . . Resin layer
13 . . . Solder ball
14 . . . Bare chip
15 . . . Mold resin
20 . . . Laminate
30 . . . Semiconductor device-mounting substrate

The invention claimed is:

1. A support comprising:
a heat resistant film layer;
a resin layer; and
a copper foil,
wherein the heat resistant film layer is laminated on at least one side (a first side) of the resin layer, and the resin layer is in a semi-cured state (B stage);
wherein the copper foil is laminated on another side (a second side) of the resin layer, the second side being opposed to the side on which the heat resistant film layer is laminated;
wherein the heat resistant film layer is a resin selected from the group consisting of polyimide resins, polyamideimide resins, nylon resins, fluorine-based resins, and mixtures of two or more thereof;
wherein an adhesive layer contacts the heat resistant film layer, and the adhesive layer comprises at least one resin selected from the group consisting of phenol resins, epoxy resins, cyanate resins, maleimide resins, isocyanate resins, benzocyclobutene resins and vinyl resins.

2. The support according to claim 1, wherein the support has a thickness of 10 to 400 μm.

3. The support according to claim 1, wherein the resin layer comprises a prepreg in which a thermosetting resin is impregnated in a glass cloth.

4. The support according to claim 3, wherein the thermosetting resin comprises at least one resin selected from the group consisting of phenol resins, epoxy resins, cyanate resins, maleimide resins, bismaleimide triazine resins, isocyanate resins, benzocyclobutene resins and vinyl resins.

5. The support according to claim 1, wherein the heat resistant film layer has a smaller surface area than the resin layer.

6. A method for producing a semiconductor device-mounting substrate in which the support according to claim 1 is used,
the production method comprising laminating, by pressing, the support on a circuit formation substrate on which a first and a second wire conductors are formed, and subsequently mounting a semiconductor device on the wire conductors.

7. The method for producing the semiconductor device-mounting substrate according to claim 6, comprising:
(a) forming a support substrate for circuit formation comprising a first insulating resin layer, a peel layer and a copper foil in this order,
(b) forming a first wire conductor on the copper foil of the support substrate for circuit formation,
(c) laminating a second insulating resin layer,
by disposing the second insulating resin layer in such a way that the second insulating resin layer is in contact with the first wire conductor; and
heating and applying a pressure on the second insulating resin layer,
(d) drilling a non-through hole reaching the first wire conductor in the second insulating resin layer; and
connecting an inner wall of the non-through hole by electro copper plating and/or electroless copper plating; and
forming a second wire conductor,
(e) peeling the first insulating resin layer from the circuit formation substrate on which the first and the second wire conductors are formed,
(f) removing the peel layer and/or the copper foil from the circuit formation substrate,
(g) laminating the support on the circuit formation substrate by pressing,
(h) mounting a semiconductor device on the wire conductors of the circuit formation substrate, and
(i) peeling the support from the circuit formation substrate.

8. The method for producing the semiconductor device-mounting substrate according to claim 7, further comprising, between (d) and (e), forming a build-up structure, by repeating the insulating resin layer lamination and the wire conductor formation on the circuit formation substrate on which the first and the second wire conductors are formed.

9. The method for producing the semiconductor device-mounting substrate according to claim 7, further comprising forming a solder resist layer between (f) and (g).

10. The method for producing the semiconductor device-mounting substrate according to claim 9, further comprising forming a gold-plated layer after forming the solder resist layer.

11. The method for producing the semiconductor device-mounting substrate according to claim 7, comprising forming a solder resist layer between (d) and (e).

12. The method for producing the semiconductor device-mounting substrate according to claim 11, further comprising forming a gold-plated layer after forming the solder resist layer.

13. The method for producing the semiconductor device-mounting substrate according to claim 6, comprising:
(a) forming a support substrate for circuit formation comprising a first insulating resin layer, a peel layer and a copper foil in this order,
(b) forming a first wire conductor on the copper foil of the support substrate for circuit formation,
(c) laminating a second insulating resin layer,
by disposing the second insulating resin layer in such a way that the second insulating resin layer is in contact with the first wire conductor; and
heating and applying a pressure on the second insulating resin layer,
(d) drilling a non-through hole reaching the first wire conductor in the second insulating resin layer; and
connecting an inner wall of the non-through hole by electro copper plating and/or electroless copper plating; and
forming a second wire conductor,
(j) laminating the support by pressing the support on the circuit formation substrate on which the first and the second wire conductors are formed,
(k) peeling the first insulating resin layer from the circuit formation substrate on which the support is laminated,
(l) removing the peel layer and/or the copper foil from the circuit formation substrate,
(h) mounting a semiconductor device on the wire conductors of the circuit formation substrate, and
(i) peeling the support from the circuit formation substrate.

14. The method for producing the semiconductor device-mounting substrate according to claim 13, further comprising, between (d) and (e), forming a build-up structure, by repeating the insulating resin layer lamination and the wire conductor formation on the circuit formation substrate on which the first and the second wire conductors are formed.

15. The method for producing the semiconductor device-mounting substrate according to claim 13, further comprising forming a solder resist layer between (l) and (h).

16. The method for producing the semiconductor device-mounting substrate according to claim 15, further comprising forming a gold-plated layer after forming the solder resist layer.

* * * * *